US009054115B2

(12) United States Patent
Hoang et al.

(10) Patent No.: US 9,054,115 B2
(45) Date of Patent: *Jun. 9, 2015

(54) METHODS FOR FABRICATING AN OVERMOLDED SEMICONDUCTOR PACKAGE WITH WIREBONDS FOR ELECTROMAGNETIC SHIELDING

(75) Inventors: Dinhphuoc V. Hoang, Stanton, CA (US); Thomas E. Noll, Aliso Viejo, CA (US); Anil K. Agarwal, Ladera Ranch, CA (US); Robert W. Warren, Newport Beach, CA (US); Matthew S. Read, Santa Margarita, CA (US); Anthony LoBianco, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 327 days.

This patent is subject to a terminal disclaimer.

(21) Appl. No.: 13/311,436

(22) Filed: Dec. 5, 2011

(65) Prior Publication Data

US 2012/0137514 A1 Jun. 7, 2012

Related U.S. Application Data

(60) Continuation of application No. 12/970,705, filed on Dec. 16, 2010, now Pat. No. 8,071,431, which is a division of application No. 11/499,285, filed on Aug. 4, 2006, now Pat. No. 8,399,972, which is a continuation-in-part of application No. 10/793,618, filed on Mar. 4, 2004, now Pat. No. 7,198,987.

(51) Int. Cl.
*H01L 21/56* (2006.01)
*H05K 3/36* (2006.01)
(Continued)

(52) U.S. Cl.
CPC ............ *H01L 23/552* (2013.01); *H01L 21/56* (2013.01); *Y10T 29/49126* (2015.01);
(Continued)

(58) Field of Classification Search
CPC ................. H01L 24/97; H01L 23/552; H01L 2924/3025; H01L 21/56
See application file for complete search history.

(56) References Cited

U.S. PATENT DOCUMENTS

| 3,816,911 A | 6/1974 | Knappenberger |
| 4,151,637 A | 5/1979 | Zemek et al. |

(Continued)

FOREIGN PATENT DOCUMENTS

| JP | 04-058596 | 2/1992 |
| JP | 08222885 A | 8/1996 |

(Continued)

OTHER PUBLICATIONS

International Search Report in PCT/US2008/001355 (WO 2008/103232), dated Jun. 18, 2008.

(Continued)

*Primary Examiner* — Long Pham
(74) *Attorney, Agent, or Firm* — Knobbe, Martens, Olson & Bear, LLP

(57) ABSTRACT

According to one exemplary embodiment, an overmolded package includes a component situated on a substrate. The overmolded package further includes an overmold situated over the component and the substrate. The overmolded package further includes a wirebond cage situated over the substrate and in the overmold, where the wirebond cage surrounds the component, and where the wirebond cage includes a number of wirebonds. The wirebond cage forms an EMI shield around the component. According to this exemplary embodiment, the overmolded package further includes a conductive layer situated on a top surface of the overmold and connected to the wirebond cage, where the conductive layer forms an EMI shield over the component.

23 Claims, 9 Drawing Sheets

(51) Int. Cl.
*H01L 23/552* (2006.01)
*H01L 23/00* (2006.01)
*H01L 23/31* (2006.01)

(52) U.S. Cl.
CPC ............ *H01L 23/3121* (2013.01); *H01L 24/97* (2013.01); *H01L 2224/48091* (2013.01); *H01L 2924/01013* (2013.01); *H01L 2924/01029* (2013.01); *H01L 2924/01047* (2013.01); *H01L 2924/01051* (2013.01); *H01L 2924/01078* (2013.01); *H01L 2924/01079* (2013.01); *H01L 2924/19042* (2013.01); *H01L 2924/19107* (2013.01); *H01L 2924/3025* (2013.01); *H01L 24/48* (2013.01); *H01L 2924/01005* (2013.01); *H01L 2924/01033* (2013.01); *H01L 2924/19105* (2013.01)

(56) References Cited

U.S. PATENT DOCUMENTS

| | | | |
|---|---|---|---|
| 4,241,497 A | 12/1980 | Du Bois | |
| 4,245,385 A | 1/1981 | Zemek et al. | |
| 4,296,421 A | 10/1981 | Hara et al. | |
| 4,447,945 A | 5/1984 | Priscsak | |
| 4,516,140 A | 5/1985 | Durkee et al. | |
| 4,588,998 A | 5/1986 | Yamamuro et al. | |
| 4,724,613 A | 2/1988 | Dale | |
| 4,857,483 A | 8/1989 | Steffen et al. | |
| 4,897,673 A | 1/1990 | Okabayashi et al. | |
| 5,151,770 A | 9/1992 | Inoue | |
| 5,166,772 A | 11/1992 | Soldner et al. | |
| 5,166,864 A | 11/1992 | Chitwood et al. | |
| 5,355,016 A | 10/1994 | Swirbel et al. | |
| 5,428,508 A | 6/1995 | Pronto | |
| 5,459,501 A | 10/1995 | Lee et al. | |
| 5,872,583 A | 2/1999 | Yamamoto et al. | |
| 5,940,964 A | 8/1999 | Mugiya | |
| 6,089,701 A | 7/2000 | Hashizume et al. | |
| 6,137,693 A | 10/2000 | Schwiebert et al. | |
| 6,192,577 B1 | 2/2001 | Larsson | |
| 6,202,294 B1 | 3/2001 | Bogannam | |
| 6,350,951 B1 | 2/2002 | Askew | |
| 6,426,881 B1 | 7/2002 | Kurz | |
| 6,449,828 B2 | 9/2002 | Pahl et al. | |
| 6,462,436 B1 | 10/2002 | Kay et al. | |
| 6,472,724 B1 | 10/2002 | Matsuzawa et al. | |
| 6,486,549 B1 | 11/2002 | Chiang | |
| 6,566,596 B1 | 5/2003 | Askew | |
| 6,601,293 B1 | 8/2003 | Glenn | |
| 6,650,009 B2 | 11/2003 | Her et al. | |
| 6,855,893 B2 | 2/2005 | Kumakura et al. | |
| 6,865,084 B2 | 3/2005 | Lin et al. | |
| 6,947,295 B2 | 9/2005 | Hsieh | |
| 6,974,724 B2 | 12/2005 | Hyvonen et al. | |
| 6,994,901 B1 | 2/2006 | Chen et al. | |
| 7,030,469 B2 | 4/2006 | Mahadevan et al. | |
| 7,088,009 B2 | 8/2006 | Hagen | |
| 7,198,987 B1 | 4/2007 | Warren et al. | |
| 7,958,629 B2 | 6/2011 | Thompson et al. | |
| 8,042,239 B2 | 10/2011 | Koizumi et al. | |
| 8,071,431 B2* | 12/2011 | Hoang et al. | 438/124 |
| 8,399,972 B2 | 3/2013 | Hoang et al. | |
| 2001/0013165 A1 | 8/2001 | Hansen et al. | |
| 2002/0083570 A1 | 7/2002 | Inoue et al. | |
| 2002/0129951 A1 | 9/2002 | Babb et al. | |
| 2002/0155738 A1 | 10/2002 | Ohsawa et al. | |
| 2003/0002271 A1 | 1/2003 | Nurminen | |
| 2003/0155987 A1 | 8/2003 | Kolb et al. | |
| 2004/0012099 A1 | 1/2004 | Nakayama | |
| 2004/0125568 A1 | 7/2004 | Tao | |
| 2004/0180474 A1 | 9/2004 | Oman | |
| 2004/0231872 A1 | 11/2004 | Arnold et al. | |
| 2004/0238934 A1 | 12/2004 | Warner et al. | |
| 2006/0113876 A1 | 6/2006 | Ikeda et al. | |
| 2006/0145361 A1 | 7/2006 | Yang et al. | |
| 2006/0197407 A1 | 9/2006 | Vile et al. | |
| 2007/0071886 A1 | 3/2007 | Babb et al. | |
| 2007/0131935 A1 | 6/2007 | Ozaki et al. | |
| 2008/0014678 A1* | 1/2008 | Howard et al. | 438/106 |
| 2008/0112151 A1 | 5/2008 | Thompson et al. | |
| 2012/0137514 A1 | 6/2012 | Hoang et al. | |

FOREIGN PATENT DOCUMENTS

| | | |
|---|---|---|
| WO | WO99/62119 A1 | 12/1999 |
| WO | WO 00/13233 A1 | 3/2000 |
| WO | WO 01/28305 A1 | 4/2001 |
| WO | WO 01/82672 A1 | 11/2001 |
| WO | WO 02/17394 A1 | 2/2002 |
| WO | WO2005/050699 A2 | 6/2005 |
| WO | WO2005/093833 A1 | 10/2005 |
| WO | WO2008/018959 A2 | 2/2008 |
| WO | WO2008/103232 A1 | 8/2008 |

OTHER PUBLICATIONS

International Preliminary Report on Patentability and Written Opinion in PCT/US2008/001355 (WO 2008/103232), dated Aug. 19, 2009.
International Search Report in PCT/US2007/015284 (WO 2008/018959), dated Feb. 7, 2008.
International Preliminary Report on Patentability and Written Opinion in PCT/US2007/015284 (WO 2008/018959), dated Feb. 10, 2009.
Supplementary European Search Report for Application No. EP05713542, dated Feb. 19, 2010.
International Search Report in PCT/US2005/004696 (WO 2005/093833), dated Jun. 22, 2005.
Written Opinion of the International Search Authority in PCT/US2005/004696 (WO 2005/093833), dated Jun. 22, 2005.
International Preliminary Report on Patentability Chapter II in PCT/US2005/004696 (WO 2005/093833), dated Mar. 13, 2006.

* cited by examiner

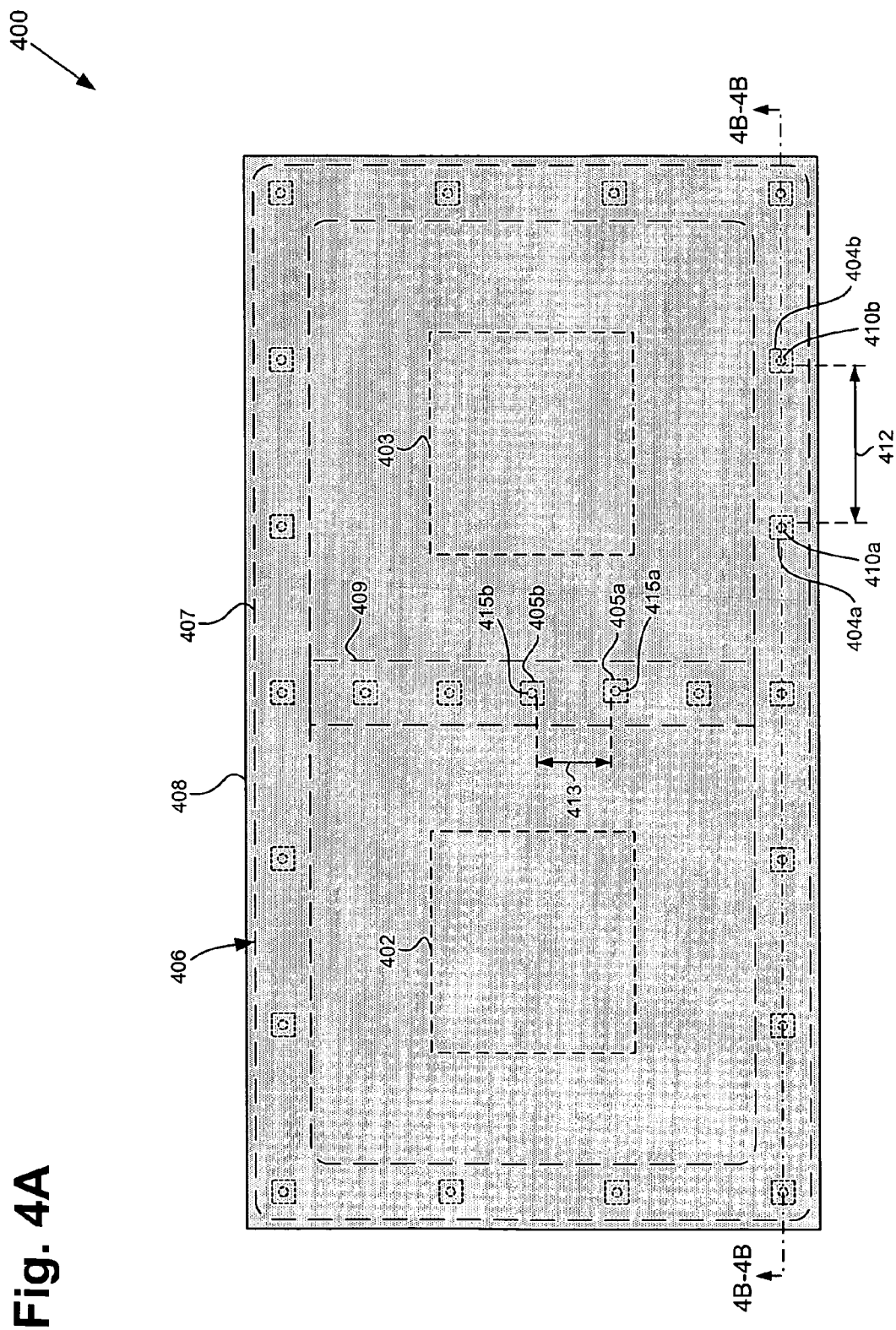

METHODS FOR FABRICATING AN OVERMOLDED SEMICONDUCTOR PACKAGE WITH WIREBONDS FOR ELECTROMAGNETIC SHIELDING

RELATED APPLICATIONS

This application is continuation of U.S. application Ser. No. 12/970,705, filed on Dec. 16, 2010, entitled "OVERMOLDED SEMICONDUCTOR PACKAGE WITH A WIREBOND CAGE FOR EMI SHIELDING," which is a divisional of U.S. patent application Ser. No. 11/499,285, filed on Aug. 4, 2006, entitled "OVERMOLDED SEMICONDUCTOR PACKAGE WITH A WIREBOND CAGE FOR EMI SHIELDING," which is a continuation-in-part of, and claims benefit of the filing date of, U.S. patent application Ser. No. 10/793,618, filed on Mar. 4, 2004, now U.S. Pat. No. 7,198,987, entitled "OVERMOLDED SEMICONDUCTOR PACKAGE WITH AN INTEGRATED EMI AND RFI SHIELD," each of which is hereby incorporated herein by reference in its entirety.

BACKGROUND OF THE INVENTION

1. Field of the Invention

The present invention is generally in the field of semiconductor devices. More particularly, the invention is in the field of semiconductor device packaging.

2. Related Art

Portable electronic devices, such as cell phones, typically utilize multi-component semiconductor modules to provide a high level of circuit integration in a single molded package. The multi-component semiconductor module can include, for example, a semiconductor die and a number of electronic components, which are mounted on a circuit board. The circuit board including the semiconductor die and electronic components can be encapsulated in a molding process to form an overmolded semiconductor package. To ensure an acceptable level of performance in devices such as cell phones, which are required to properly operate in diverse environments, the overmolded semiconductor package must be shielded from Electro-Magnetic Interference (EMI), which includes Radio Frequency Interference (RFI). However, semiconductor device manufacturers are challenged to provide effective EMI shielding for an overmolded semiconductor package without increasing the size of the package and without substantially increasing packaging cost.

In one approach, EMI shielding is provided a prefabricated metal shield, which is formed over the overmolded semiconductor package. The prefabricated metal shield typically includes a wall, which is formed around the overmolded semiconductor package, and a cover, which is attached to the wall and situated a sufficient distance above the overmolded package to avoid interfering with the package. As a result, the prefabricated metal shield undesirably increases the thickness of the final overmolded package. Also, the formation of the prefabricated metal shield requires an extra process step and additional materials, which significantly increases packaging cost.

In another approach, conductive foam or rubber is applied over the overmolded semiconductor package to absorb and trap EMI. However, the conductive foam or rubber must be applied manually and requires special materials and an extra process, which significantly increases packaging cost. Additionally, the conductive foam or rubber undesirably increases the thickness of the final overmolded package.

Thus, there is a need in the art for a cost-effective EMI shield for an overmolded semiconductor package that does not substantially increase package thickness.

SUMMARY OF THE INVENTION

The present invention is directed to an overmolded semiconductor package with a wirebond cage for EMI shielding. The present invention addresses and resolves the need in the art for a cost-effective EMI shield for an overmolded semiconductor package that does not substantially increase package thickness.

According to one exemplary embodiment, an overmolded package includes a component situated on a substrate. For example, the component can be an active device or a passive device. The overmolded package further includes an overmold situated over the component and the substrate. The overmolded package further includes a wirebond cage situated over the substrate and in the overmold, where the wirebond cage surrounds the component, and where the wirebond cage includes a number of wirebonds. The wirebond cage forms an EMI shield around the component.

According to this exemplary embodiment, the overmolded package further includes a conductive layer situated on a top surface of the overmold and connected to the wirebond cage, where the conductive layer forms an EMI shield over the component. For example, the conductive layer may be conductive ink. For example, each of the wirebonds can have a first and second ends and a middle portion, where the first and second ends are connected to respective bond pads on the substrate and the middle portion is connected to the conductive layer. For example, each of the wirebonds can have first and second ends, where the first end is connected to a bond pad on the substrate and the second end is connected to the conductive layer.

According to one embodiment, the invention is a method for achieving the above-described structure. Other features and advantages of the present invention will become more readily apparent to those of ordinary skill in the art after reviewing the following detailed description and accompanying drawings.

BRIEF DESCRIPTION OF THE DRAWINGS

FIG. 4A illustrates a top view of an exemplary overmolded semiconductor package in accordance with one embodiment of the present invention.

DETAILED DESCRIPTION OF THE INVENTION

The present invention is directed to an overmolded semiconductor package with a wirebond cage for EMI shielding. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
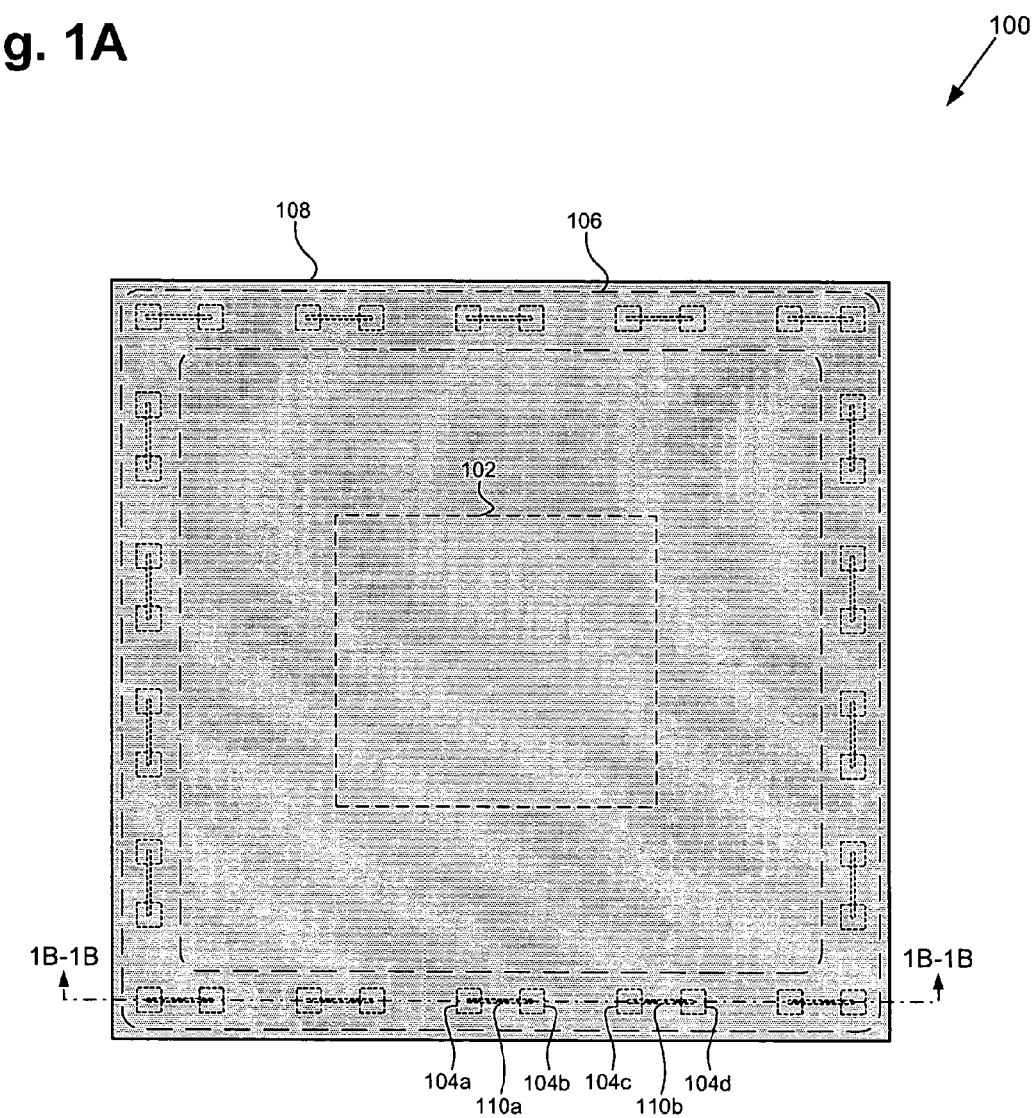
FIG. 1A illustrates a top view of an exemplary overmolded semiconductor package in accordance with one embodiment of the present invention.

FIG. 1A shows a top view of an exemplary overmolded semiconductor package in accordance with one embodiment of the present invention. Certain details and features have been left out of FIG. 1A that are apparent to a person of ordinary skill in the art. Overmolded semiconductor package 100, which is also referred to as an "overmolded package" in the present application, includes component 102, bond pads 104a, 104b, 104c, and 104d (hereinafter "bond pads 104a through 104d"), wirebond cage 106, and conductive layer 108. Wirebond cage 106 includes a number of wirebonds, such as wirebonds 110a and 110b. It is noted that only bond pads 104a through 104e and wirebonds 110a through 110e are discussed in detail herein to preserve brevity.

As shown in FIG. 1A, component 102 is situated on a substrate (not shown in FIG. 1A). Component 102 can be an active device, such as a semiconductor die, which can include RF circuitry, for example. In one embodiment, component 102 can be a passive device, such as an inductor. Also shown in FIG. 1A, bond pads 104a through 104d are situated on and along the perimeter of the substrate (not shown in FIG. 1A). Bond pads 104a through 104d can comprise a metal such as copper or aluminum and can be formed, for example, by depositing and patterning a layer of metal, such as copper or aluminum, and plating the layer of metal with gold. Bond pads 104a through 104d can be connected to a reference potential (not shown in FIG. 1A), which can be any constant DC plane that does not have an AC component.

Further shown in FIG. 1A, respective ends of wirebond 110a are situated on bond pads 104a and 104b and respective ends of wirebond 110b are situated on bond pads 104c and 104d. Thus, wirebond 110a forms a loop that extends between bond pads 104a and 104b and wirebond 110b forms a loop that extends between bond pads 104c and 104d. Wirebonds 110a and 110b can comprise gold or other suitable metal, for example. The respective ends of wirebond 110a can be attached to bond pads 104a and 104b and the respective ends of wirebond 110b can be attached to bond pads 104c and 104d by utilizing a suitable bonding process, for example. Wirebonds 110a and 110b form a portion of wirebond cage 106, which extends along the perimeter of the substrate (not shown in FIG. 1A).

Also shown in FIG. 1A, conductive layer 108 is situated on an overmold (not shown in FIG. 1A). Conductive layer 108 is also situated over component 102, bond pads 104a through 104d, wirebonds 110a and 110b, and the substrate (not shown in FIG. 1A). In the present embodiment, conductive layer 108 can comprise a conductive coating, such as a conductive ink, which can include copper, silver, or other conductive metals. In another embodiment, conductive layer 108 can comprise a layer of copper, aluminum, or other suitable metal. Conductive layer 108 is connected to a middle portion of each of the wirebonds (e.g. wirebonds 110a and 110b) in wirebond cage 106. Conductive layer 108 and wirebonds 110a and 110b will be further discussed below in relation to FIG. 1B.

Figure 1B:
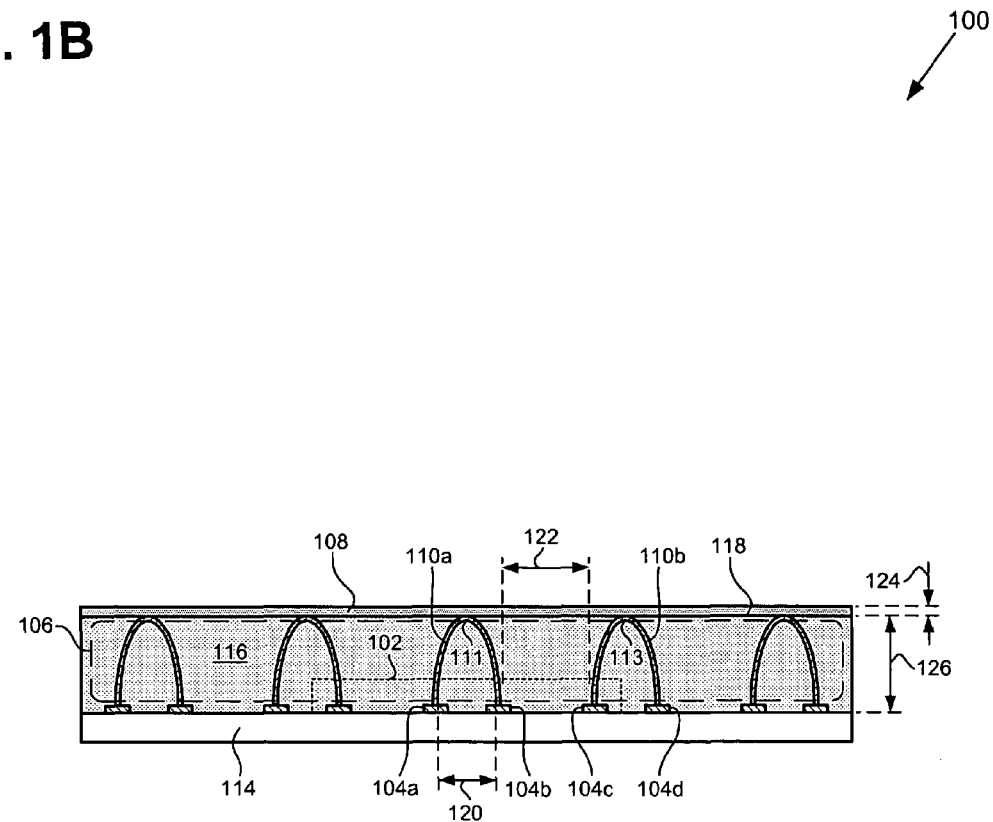
FIG. 1B illustrates a cross sectional view of the exemplary structure of FIG. 1A.

Referring now to FIG. 1B, a cross-sectional view is shown of overmolded semiconductor package 100 in FIG. 1A along line 1B-1B in FIG. 1A. In particular, component 102, bond pads 104a through 104d, wirebond cage 106, conductive layer 108, and wirebonds 110a and 110b correspond to the same elements in FIG. 1A and FIG. 1B. As shown in FIG. 1B, component 102 and bond pads 104a through 104d are situated on substrate 114, which can comprise a ceramic material, a laminate material, or other suitable type of material. Although not shown in FIG. 1B, substrate 114 can include a patterned metal layer on top and bottom substrate surfaces and vias, for example.

Also shown in FIG. 1B, the respective ends of wirebond 110a are situated on bond pads 104a and 104b and middle portion 111 of wirebond 110a is in contact with conductive layer 108. Further shown in FIG. 1B, the respective ends of wirebond 110b are situated on bond pads 104c and 104d and middle portion 113 of wirebond 110b is in contact with conductive layer 108. Also shown in FIG. 1B, the ends of each wirebond (e.g. wirebonds 110a and 110b) are separated by wirebond loop width 120 and adjacent wirebonds (e.g. wirebonds 110a and 110b) are separated by wirebond spacing 122. In the embodiment in FIGS. 1A and 1B, wirebond loop width 120 can be different than wirebond spacing 122. In one embodiment, wirebond loop width 120 can be substantially equal to wirebond spacing 122. Wirebond loop width 120 and wirebond spacing 122 can each range in value from microns to millimeters, for example. In the embodiment in FIGS. 1A and 1B, wirebond loop width 120 and wirebond spacing 122 can be selected to achieve EMI shielding for a particular frequency or a particular range of frequencies.

Further shown in FIG. 1B, overmold 116 is situated over component 102, bond pads 104a through 104d, and substrate 114 and encapsulates wirebond cage 106, which includes wirebonds 110a and 110b. Overmold 116 can comprise epoxy or other suitable molding compound and can be formed in a molding process in a manner known in the art. Also shown in FIG. 1B, conductive layer 108 is situated on top surface 118 of overmold 116 and situated over component 102, bond pads 104a through 104d and substrate 114. Conductive layer 108 is also situated over and in contact with wirebonds 110a and 110b. Conductive layer 108 has thickness 124, which can be between 25.0 microns and 50.0 microns, for example. In other embodiments, thickness 124 can be between 5.0 microns and 100.0 microns. Conductive layer 108 has height 126, which refers to the distance between the top surface of substrate 114 and top surface 118 of overmold 116. Height 126 can be approximately 1.0 mm, for example. However, height 126 may also be greater or less than 1.0 mm.

In overmolded semiconductor package 100, conductive layer 108 and wirebond cage 106, which are electrically connected together, form an EMI shield for component 102. The EMI shield can be formed during formation of overmolded semiconductor package 100 by bonding the ends of wirebonds to respective bond pads, which can be formed on the top surface of substrate 114. The ends of wirebond 110a can be bonded to respective bond pads 104a and 104b, for example. Overmold 116 can then be formed by utilizing a mold compound, such as epoxy, in a molding process as known in the art to cover component 102, the bond pads (e.g. bond pads 104a through 104d), and the top surface of substrate 114 and to encapsulate the wirebonds (e.g. wirebonds 110a and 110b) that form wirebond cage 106.

Overmold 116 is desirably formed such that the center portion of each wirebond (e.g. center portions 111 and 113 of respective wirebonds 110a and 110b) in wirebond cage 106 is exposed above top surface 118 of overmold 116. However, overmold 116 may inadvertently cover the center portions of the wirebonds in wirebond cage 106. In such case, the covering portion of overmold 116 can be removed from the center portions of the wirebonds by utilizing a laser abrasion process, a mechanical milling process, a diamond polish process, or other suitable process. Conductive layer 108 can then be formed by utilizing a screen printing process, spraying process, electroplating process, thermal spray deposition process, or other suitable process to apply a layer of conductive ink on top surface 118 of overmold 116 and on the exposed center portions of the wirebonds in wirebond cage 106. In an embodiment in which conductive layer 108 comprises a layer of metal, the layer of metal can be deposited on top surface 118 of overmold 116 and on the exposed center portions of the wirebonds by utilizing a chemical vapor deposition (CVD) process or other suitable deposition processes.

In the embodiment in FIGS. 1A and 1B, the invention's overmolded package includes conductive layer 108, which provides EMI shielding over component 102, and wirebond cage 106, which provides EMI shielding around component 102. Thus, in the embodiment in FIGS. 1A and 1B, the invention utilizes a conductive layer and a wirebond cage to achieve an effective EMI shield for an overmolded package. For example, in the embodiment in FIGS. 1A and 1B, the invention can provide an EMI shield between a component, such as an active device, inside the overmolded package and the environment outside of the package.

Also, by forming an EMI shield that includes a wirebond cage, which includes multiple wirebonds, and a conductive layer, which is formed over an overmold, the invention advantageously achieves an EMI shield having a low manufacturing cost compared to a conventional prefabricated metal shield. Additionally, the conductive layer in the invention's EMI shield is significantly thinner than metal utilized to form the conventional prefabricated metal shield. As a result, the invention's EMI shield results in a thinner overmolded package compared to an overmolded package that includes a conventional prefabricated metal shield.

Furthermore, by utilizing wirebonds to form an EMI shield, the invention provides an EMI shield having a flexible design that can more easily accommodate variations in package size and has increased scalability compared to a conventional prefabricated metal shield. Moreover, since wirebonds are significantly thinner than the walls of the conventional prefabricated metal shield, the invention's EMI shield consumes less space in the overmolded package compared to the conventional prefabricated metal shield.

Figure 2A:
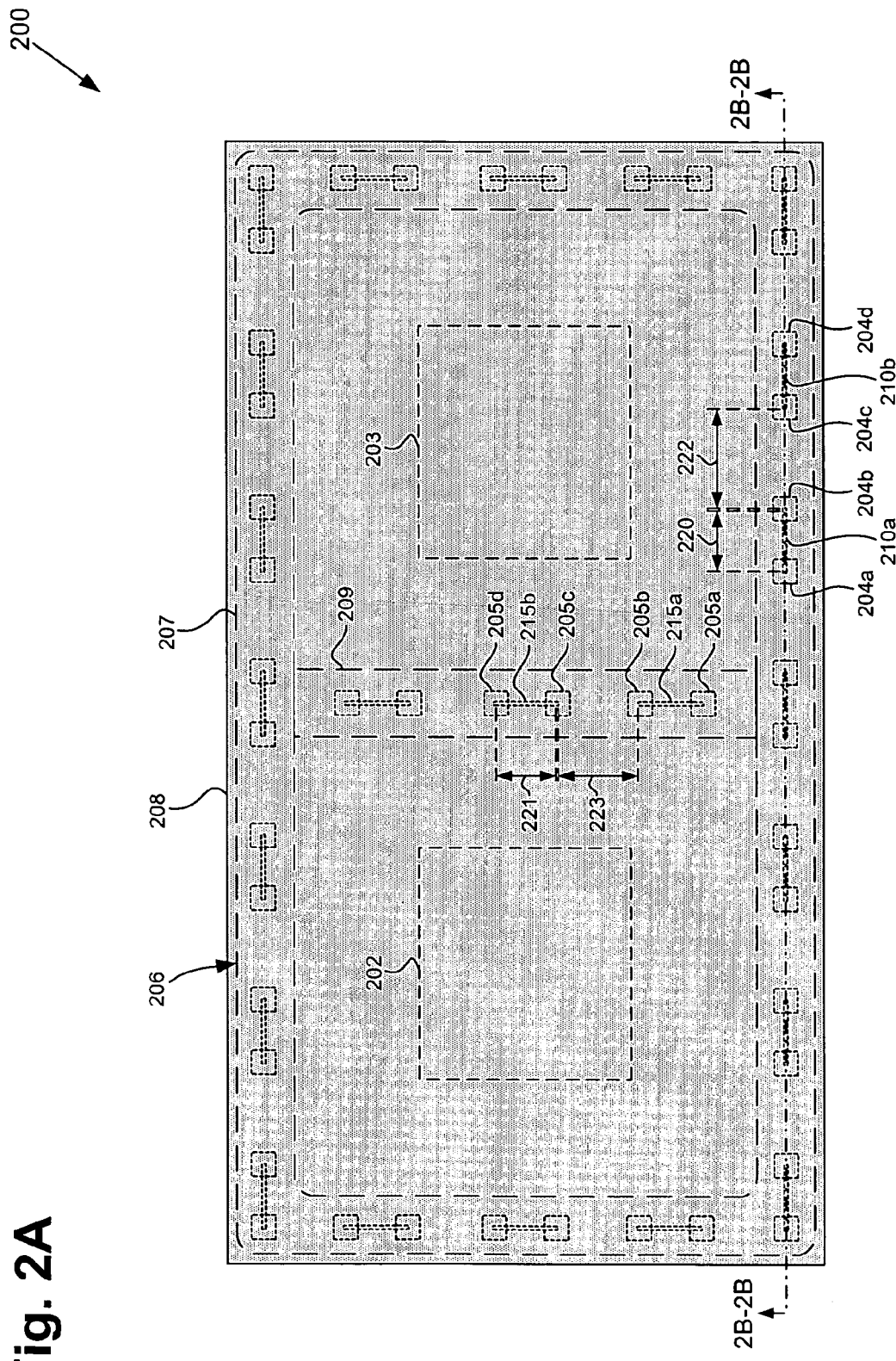
FIG. 2A illustrates a top view of an exemplary overmolded semiconductor package in accordance with one embodiment of the present invention.

FIG. 2A shows a top view of an exemplary overmolded semiconductor package in accordance to one embodiment of the present invention. Certain details and features have been left out of FIG. 2A that are apparent to a person of ordinary skill in the art. Overmolded semiconductor package 200, which is also referred to as an "overmolded package" in the present application, includes components 202 and 203, bond pads 204a, 204b, 204c, and 204d (hereinafter "bond pads 204a through 204d"), bond pads 205a, 205b, 205c, and 205d (hereinafter "bond pads 205a through 205d"), wirebond cage 206, and conductive layer 208. Wirebond cage 206 includes wirebond cage section 207, which includes wirebonds 210a and 210b, and wirebond cage section 209, which includes wirebonds 215a and 215b. It is noted that only bond pads 204a through 204d and 205a through 205d and wirebonds 210a, 210b, 215a, and 215b are discussed in detail herein to preserve brevity.

As shown in FIG. 2A, components 202 and 203 are situated on a substrate (not shown in FIG. 2A). In the embodiment in FIG. 2A, components 202 and 203 can each be an active device, such as a semiconductor die, which can include RF circuitry, for example. In one embodiment, component 202 can be a passive device, such as an inductor, and component 203 can be an active device, such as a semiconductor die. In another embodiment, components 202 and 203 can each be a passive device. Also shown in FIG. 2A, bond pads 204a through 204d and 205a through 205d are situated on the substrate (not shown in FIG. 2A) and are substantially similar in composition and formation to bond pads 104a through 104d in FIGS. 1A and 1B. Bond pads 204a through 204d and 205a through 205d can be connected to a reference potential (not shown in FIG. 2A), which can be any constant DC plane that does not have an AC component.

Further shown in FIG. 2A, respective ends of wirebond 210a are situated on bond pads 204a and 204b and respective ends of wirebond 210b are situated on bond pads 204c and 204d. Wirebonds 210a and 210b are substantially similar in composition and formation to wirebonds 110a and 110b in FIGS. 1A and 1B. Also shown in FIG. 2A, respective ends of wirebond 215a are situated on bond pads 205a and 205b and respective ends of wirebond 215b are situated on bond pads 205c and 205d. Wirebonds 215a and 215b are also substantially similar in composition and formation to wirebonds 110a and 110b in FIGS. 1A and 1B. Wirebonds 210a and 210b form a portion of wirebond cage section 207, which extends along the perimeter of the substrate (not shown in FIG. 2A), and wirebonds 215a and 215b form a portion of wirebond cage section 209, which is situated between components 202 and 203.

Further shown in FIG. 2A, in wirebond cage section 207, the ends of each wirebond (e.g. wirebond 210a) are separated by wirebond loop width 220 and adjacent wirebonds (e.g. wirebonds 210a and 210b) are separated by wirebond spacing 222. In wirebond cage section 209, the ends of each wirebond (e.g. wirebonds 215a) are separated by wirebond loop width 221 and adjacent wirebonds (e.g. wirebonds 215a and 215b) are separated by wirebond spacing 223. In the embodiment in FIG. 2A, wirebond loop width 220 can be different than wirebond spacing 222 and wirebond loop width 221 can be different than wirebond spacing 223. Also, wirebond loop width 220 can be different than wirebond loop width 221 and wirebond spacing 222 can be different than wirebond spacing 223. In one embodiment, wirebond loop width 220 can be substantially equal to equal to wirebond spacing 222 and wirebond loop width 221 can be substantially equal to wirebond spacing 223. Wirebond loop widths 220 and 221 and wirebond spacings 222 and 223 can each range in value from microns to millimeters, for example. The value of each of wirebond loop widths 220 and 221 and wirebond spacings 222 and 223 can be selected to provide EMI shielding for a particular frequency or range of frequencies.

Also shown in FIG. 2A, conductive layer 208 is situated on an overmold (not shown in FIG. 2A) and also situated over components 202 and 203, bond pads 204a through 204d and 205a through 205d, wirebonds 210a, 210b, 215a, and 215b, and the substrate (not shown in FIG. 2A). Conductive layer 208 is substantially similar in composition and formation to conductive layer 108 in FIGS. 1A and 1B. In the embodiment in FIG. 2A, conductive layer 208 can comprise a conductive coating, such as a conductive ink. In another embodiment, conductive layer 208 can comprise a layer of copper, aluminum, or other suitable metal. Conductive layer 208 is connected to a middle portion of each of the wirebonds (e.g. wirebonds 210a and 210b) in wirebond cage section 207 and connected to a middle portion of each of the wirebonds (e.g. wirebonds 215a and 215b) in wirebond cage section 209. Conductive layer 208 and wirebonds 210a and 210b will be further discussed below in relation to FIG. 2B.

Figure 2B:
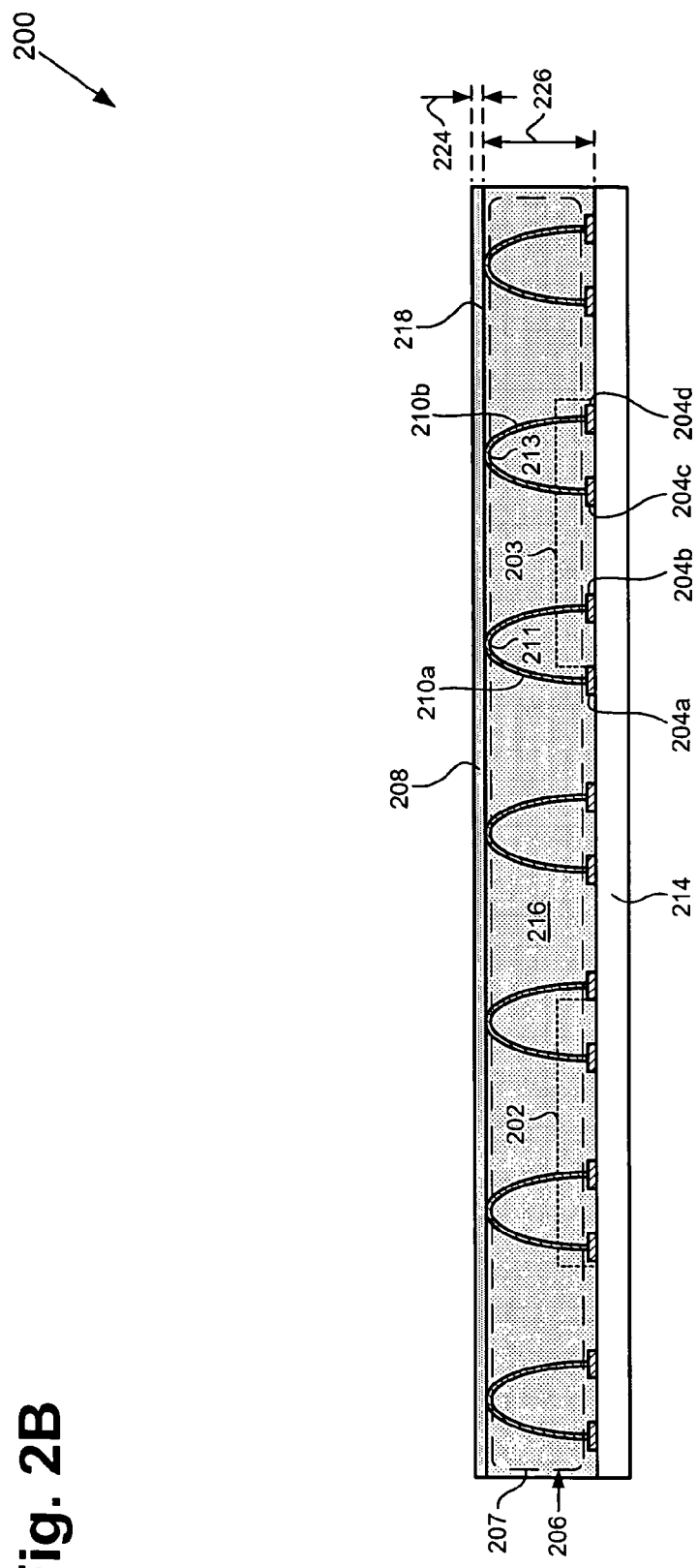
FIG. 2B illustrates a cross sectional view of the exemplary structure of FIG. 2A.

Referring now to FIG. 2B, a cross-sectional view is shown of overmolded semiconductor package 200 in FIG. 2A along line 2B-2B in FIG. 2A. In particular, components 202 and 203, bond pads 204a through 204d, wirebond cage 206, wirebond cage section 207, conductive layer 208, and wirebonds 210a and 210b correspond to the same elements in FIG. 2A and FIG. 2B. As shown in FIG. 2B, components 202 and 203 and bond pads 204a through 204d are situated on substrate 214, which is substantially similar in composition to substrate 114 in FIGS. 1A and 1B. Also shown in FIG. 2B, the respective ends of wirebond 210a are situated on bond pads 204a and 204b and middle portion 211 of wirebond 210a is in contact with conductive layer 208. Further shown in FIG. 2B, the respective ends of wirebond 210b are situated on bond pads 204c and 204d and middle portion 213 of wirebond 210b is in contact with conductive layer 208.

Further shown in FIG. 2B, overmold 216 is situated over components 202 and 203, bond pads 204a through 204d, and substrate 214 and encapsulates wirebond cage 206, which includes wirebonds 210a and 210b. Overmold 216 is substantially similar in composition and formation to overmold 116 in FIG. 1B. Also shown in FIG. 2B, conductive layer 208 is situated on top surface 218 of overmold 216 and situated over components 202 and 203, bond pads 204a through 204d and substrate 214. Conductive layer 208 is also situated over and in contact with wirebonds 210a and 210b. Conductive layer 208 is substantially similar in composition, thickness, and formation to conductive layer 108 in FIGS. 1A and 1B.

In overmolded semiconductor package 200, conductive layer 208 and wirebond cage 206, which are electrically connected together, form an EMI shield for components 202 and 203. In the embodiment in FIGS. 2A and 2B, the EMI shield, which includes conductive layer 208 and wirebond cage 206, can be formed in a similar manner as the EMI shield in the embodiment in FIGS. 1A and 1B.

In the embodiment in FIGS. 2A and 2B, the invention's overmolded package includes conductive layer 208, which provides EMI shielding over components 202 and 203, wirebond cage section 207, which provides EMI shielding around components 202 and 203, and wirebond cage section 209, which provides EMI shielding between components 202 and 203. Thus, in the embodiment in FIGS. 2A and 2B, the invention utilizes a conductive layer and wirebond cage sections to advantageously achieve an effective EMI shield between two components inside an overmolded package and the environment outside of the package and an effective EMI shield between the two components inside the package. The embodiment in FIGS. 2A and 2B also provides similar advantages as discussed above for the embodiment in FIGS. 1A and 1B.

Figure 3A:
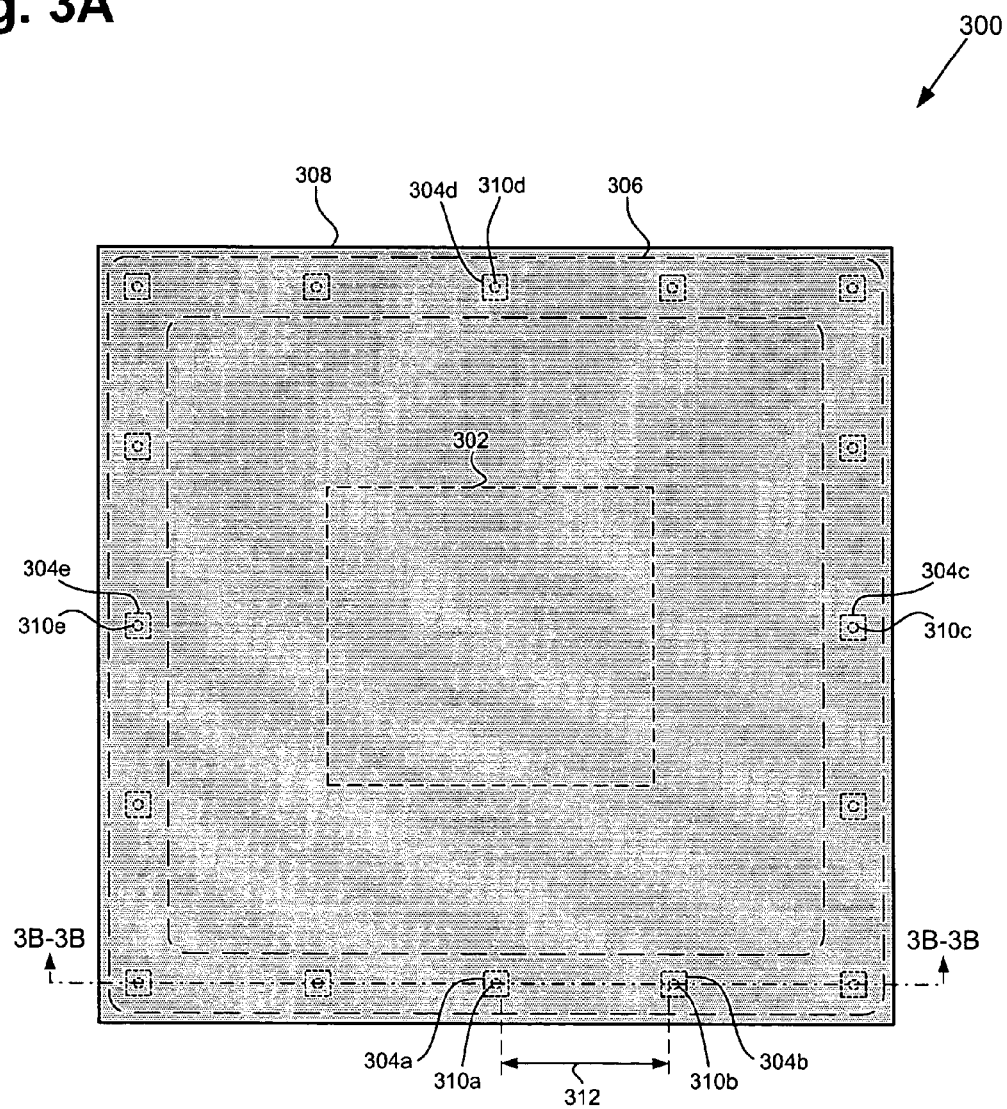
FIG. 3A illustrates a top view of an exemplary overmolded semiconductor package in accordance with one embodiment of the present invention.

FIG. 3A shows a top view of an exemplary overmolded semiconductor package in accordance to one embodiment of the present invention. Certain details and features have been left out of FIG. 3A that are apparent to a person of ordinary skill in the art. Overmolded semiconductor package 300, which is also referred to as an "overmolded package" in the present application, includes component 302, bond pads 304a, 304b, 304c, 304d, and 304e (hereinafter "bond pads 304a through 304e"), wirebond cage 306, and conductive layer 308. Wirebond cage 304 includes wirebonds 310a, 310b, 310c, 310d, and 310e (hereinafter "wirebonds 310a through 310e"). It is noted that only bond pads 304a through 304e and wirebonds 310a through 310e are discussed in detail herein to preserve brevity.

As shown in FIG. 3A, component 302 is situated on a substrate (not shown in FIG. 3A). Component 302 can be an active device, such as a semiconductor die with RF circuitry. In one embodiment, component 302 can be a passive device, such as an inductor. Also shown in FIG. 3A, bond pads 304a through 304e are situated on and along the perimeter of the substrate (not shown in FIG. 3A). Bond pads 304a through 304e can comprise a metal such as copper or aluminum and can be formed, for example, by depositing and patterning a layer of metal, such as copper or aluminum, and plating the layer of metal with gold. Bond pads 304a through 304e can be connected to a reference potential (not shown in FIG. 3A), which can be any constant DC plane that does not have an AC component.

Further shown in FIG. 3A, wirebonds 310a through 310e are situated on respective bond pads 304a through 304e and form wirebond cage 306, which surrounds component 302. Wirebonds 310a through 310e can comprise gold or other suitable metal and can be connected to respective bond pads 304a through 304e by using a bonding process, for example. Also shown in FIG. 3A, wirebond spacing 312 refers to the distance between adjacent wirebonds (e.g. the distance between wirebonds 310a and 310b). Wirebond spacing 312 can range in value from microns to millimeters. In one embodiment, wirebond spacing 312 can be approximately 2.5 mm. The value of wirebond spacing 312 can be selected to provide EMI shielding for a particular frequency or range of frequencies.

Further shown in FIG. 3A, conductive layer 308 is situated on overmold (not shown in FIG. 3A). Conductive layer 308 is also situated over component 302, bond pads 304a through 304e, wirebonds 310a through 310e, and the substrate (not shown in FIG. 3A). Conductive layer 308 can comprise a conductive coating, such as a conductive ink, which can include copper, silver, or other conductive metals. In another embodiment, conductive layer 308 can comprise a layer of copper, aluminum, or other suitable metal. Conductive layer 308 is connected to an end of each of the wirebonds (e.g. wirebonds 310a through 310e) in wirebond cage 306.

Figure 3B:
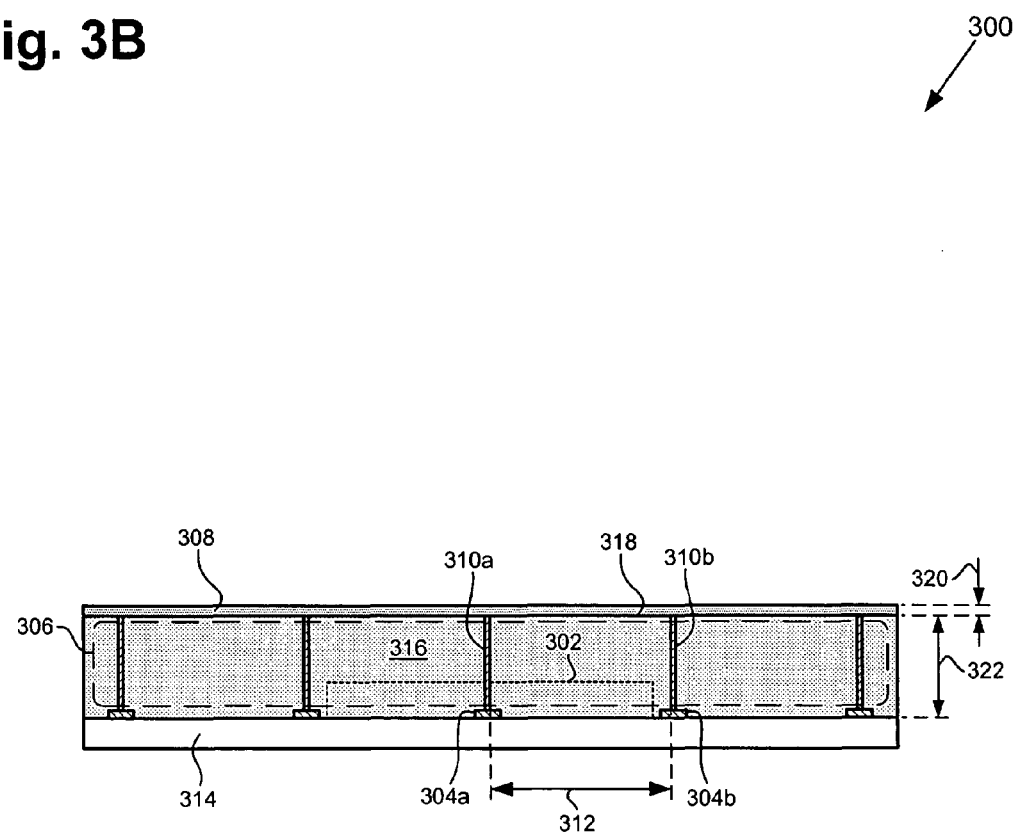
FIG. 3B illustrates a cross sectional view of the exemplary structure of FIG. 3A.

Referring now to FIG. 3B, a cross-sectional view is shown of overmolded semiconductor package 300 in FIG. 3A along line 3B-3B in FIG. 3A. In particular, component 302, bond pads 304a and 304b, wirebond cage 306, conductive layer 308, wirebonds 310a and 310b, and wirebond spacing 312 correspond to the same elements in FIG. 3A and FIG. 3B. As shown in FIG. 3B, component 302 and bond pads 304a and 304b are situated on substrate 314, which can comprise a ceramic material, a laminate material, or other suitable type of material. Although not shown in FIG. 3B, substrate 314 can include a patterned metal layer on top and bottom substrate surfaces and vias, for example.

Also shown in FIG. 3B, overmold 316 is situated over component 302, bond pads 304a and 304b, and substrate 314 and encapsulates wirebond cage 306, which includes wirebonds 310a and 310b. Overmold 316 is substantially similar in composition and formation as overmold 116 in FIG. 1B. Further shown in FIG. 3B, conductive layer 308 is situated on top surface 318 of overmold 316 and situated over component 302, bond pads 304a and 304b and substrate 314. Conductive layer 308 is also situated over and in contact with wirebonds 310a and 310b of wirebond cage 306. Conductive layer 308 has thickness 320 and height 322, which are substantially similar to thickness 124 and height 126 in FIG. 1B, respectively.

Further shown in FIG. 3B, wirebonds 310a and 310b of wirebond cage 306 are situated between respective bond pads 304a and 304b and conductive layer 308 and also situated in (i.e. encapsulated by) overmold 316. In particular, one end of each of wirebonds 310a and 310b is bonded to respective bond pads 304a and 304b and the other end of each of wirebonds 310a and 310b is in contact with conductive layer 308.

In overmolded semiconductor package 300, conductive layer 308 and wirebond cage 306, which are electrically connected together, form an EMI shield for component 302. The EMI shield can be formed during formation of overmolded semiconductor package 300 by bonding one end of each of the wirebonds (e.g. wirebond 310a) that form wirebond cage 306 to a bond pad (e.g. bond pad 304a) by using a suitable bonding process as is know in the art. Overmold 316 can then be formed by utilizing a mold compound, such as epoxy, in a molding process as known in the art to cover component 302, the bond pads (e.g. bond pads 304a and 304b), and the top surface of substrate 314 and to encapsulate the wirebonds (e.g. wirebonds 310a and 310b) that form wirebond cage 306.

Overmold 316 is desirably formed such that the unattached ends of the wirebonds (e.g. wirebonds 310a and 310b) in wirebond cage 306 are exposed above top surface 318 of overmold 316. However, if overmold 316 inadvertently covers the unattached ends of the wirebonds in wirebond cage 306, the unattached wirebond ends can be exposed by utilizing a laser abrasion process, a mechanical milling process, a diamond polish process, or other suitable process to remove the covering portion of overmold 316. Conductive layer 308 can then be formed by utilizing a screen printing process, spraying process, electroplating process, or thermal spray deposition process to apply a layer of conductive ink on top surface 318 of overmold 316 and on the exposed ends of the wirebonds in wirebond cage 306. In an embodiment in which conductive layer 308 comprises a layer of metal, the layer of metal can be deposited on top surface 318 of overmold 316 and on the exposed wirebond ends by utilizing a CVD process or other suitable deposition processes.

In the embodiment of the invention in FIGS. 3A and 3B, the invention's overmolded package includes conductive layer 308, which provides EMI shielding over component 302, and wirebond cage 306, which provides EMI shielding around component 302. Thus, in the embodiment in FIGS. 3A and 3B, the invention utilizes a conductive layer and a wirebond cage to achieve an effective EMI shield between a component inside an overmolded package and the environment outside of the package. The embodiment in FIGS. 3A and 3B also provides similar advantages as discussed above for the embodiment in FIGS. 1A and 1B.

FIG. 4A shows a top view of an exemplary overmolded semiconductor package in accordance with one embodiment of the present invention. Certain details and features have been left out of FIG. 4A that are apparent to a person of ordinary skill in the art. Overmolded semiconductor package 400, which is also referred to as an "overmolded package" in the present application, includes components 402 and 403, bond pads 404a, 404b, 405a, and 405b, wirebond cage 406, and conductive layer 408. Wirebond cage 406 includes wirebond cage section 407, which includes wirebonds 410a and 410b, and wirebond cage section 409, which includes wirebonds 415a and 415b. It is noted that only bond pads 404a, 404b, 405a, and 405b and wirebonds 410a, 410b, 415a, and 415b are discussed in detail herein to preserve brevity.

As shown in FIG. 4A, components 402 and 403 are situated on a substrate (not shown in FIG. 4A). In the embodiment in FIG. 4A, components 402 and 403 can each be an active device, such as a semiconductor die, which can include RF circuitry, for example. In one embodiment, component 402 can be a passive device, such as an inductor, and component 403 can be an active device, such as a semiconductor die. In another embodiment, components 402 and 403 can each be a passive device. Also shown in FIG. 4A, bond pads 404a, 404b, 405a, and 405b are situated on the substrate (not shown in FIG. 4A) and are substantially similar in composition and formation to bond pads 304a through 3043 in FIG. 3A. Bond pads 404a, 404b, 405a, and 405b can be connected to a reference potential (not shown in FIG. 4A), which can be any constant DC plane that does not have an AC component.

Further shown in FIG. 4A, respective ends of wirebonds 410a and 410b are situated on bond pads 404a and 404b and respective ends of wirebonds 415a and 415b are situated on bond pads 405a and 405b. Wirebonds 410a, 410b, 415a, and 415b are substantially similar in composition and formation to wirebonds 310a through 310e in FIG. 3A. Wirebonds 410a and 410b form a portion of wirebond cage section 407, which extends along the perimeter of the substrate (not shown in FIG. 4A), and wirebonds 415a and 415b form a portion of wirebond cage section 409, which is situated between components 402 and 403.

Also shown in FIG. 4A, in wirebond cage section 407, adjacent wirebonds (e.g. wirebonds 410a and 410b) are separated by wirebond spacing 412. In wirebond cage section 409, adjacent wirebonds (e.g. wirebonds 415a and 415b) are separated by wirebond spacing 413. In the embodiment in FIG. 4A, wirebond spacing 412 can be different than wirebond spacing 413. In one embodiment, wirebond spacing 412 can be substantially equal to wirebond spacing 413. Wirebond spacing 412 and wirebond spacing 413 can range in value from microns to millimeters, for example. The value of each of wirebond spacings 412 and 413 can be selected to provide EMI shielding for a particular frequency or range of frequencies.

Figure 4B:
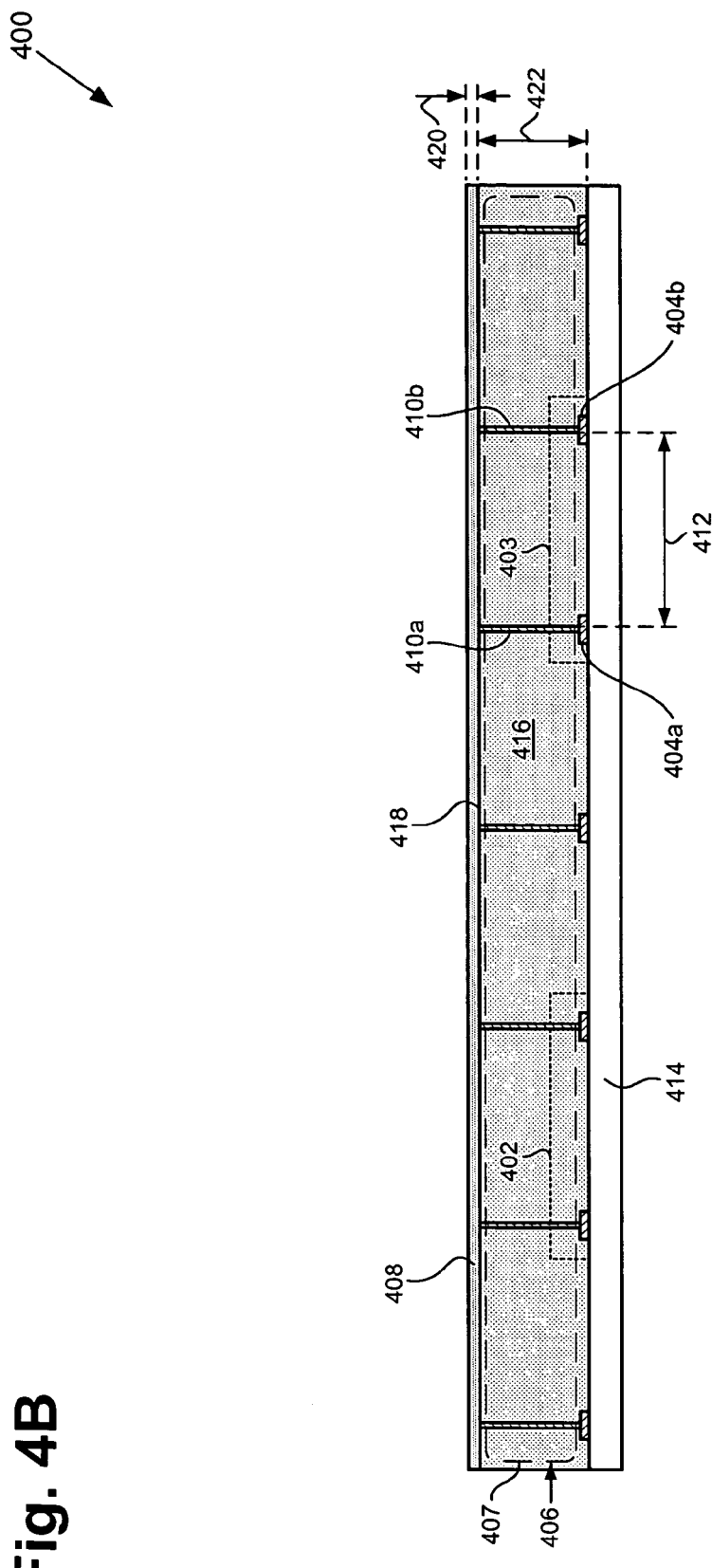
FIG. 4B illustrates a cross sectional view of the exemplary structure of FIG. 4A.

Also shown in FIG. 4A, conductive layer 408 is situated on an overmold (not shown in FIG. 4A) and also situated over components 402 and 403, bond pads 404a, 404b, 405a, and 405b, wirebonds 410a, 410b, 415a, and 415b, and the substrate (not shown in FIG. 4A). Conductive layer 408 is substantially similar in composition and formation to conductive layer 308 in FIGS. 3A and 3B. In the embodiment in FIG. 4A, conductive layer 408 can comprise a conductive coating, such as a conductive ink. In another embodiment, conductive layer 408 can comprise a layer of copper, aluminum, or other suitable metal. Conductive layer 408 is connected to an end of each of the wirebonds (e.g. wirebonds 410a and 410b) in wirebond cage section 407 and connected to an end of each of the wirebonds (e.g. wirebonds 415a and 415b) in wirebond cage section 409. Conductive layer 408 and wirebonds 410a and 410b will be further discussed below in relation to FIG. 4B.

Referring now to FIG. 4B, a cross-sectional view is shown of overmolded semiconductor package 400 in FIG. 4A along line 4B-4B in FIG. 4A. In particular, components 402 and 403, bond pads 404a and 404b, wirebond cage 406, wirebond cage section 407, conductive layer 408, wirebonds 410a and 410b, and wirebond spacing 412 correspond to the same elements in FIG. 4A and FIG. 4B. As shown in FIG. 4B, components 402 and 403 and bond pads 404a and 404b are situated on substrate 414, which is substantially similar in composition to substrate 314 in FIGS. 3A and 3B. Also shown in FIG. 4B, wirebonds 410a and 410b are situated between respective bond pads 404a and 404b and conductive layer 408.

Further shown in FIG. 4B, overmold 416 is situated over components 402 and 403, bond pads 404a and 404b, and substrate 414 and encapsulates wirebond cage 406, which includes wirebonds 410a and 410b. Overmold 416 is substantially similar in composition and formation to overmold 316 in FIG. 3B. Also shown in FIG. 4B, conductive layer 408 is situated on top surface 418 of overmold 416 and situated over components 402 and 403, bond pads 404a and 404b and substrate 414. Conductive layer 408 is also situated over and in contact with wirebonds 410a and 410b and is substantially similar in composition, thickness, and formation to conductive layer 308 in FIGS. 3A and 3B.

In overmolded semiconductor package 400, conductive layer 408 and wirebond cage 406, which are electrically connected together, form an EMI shield for components 402 and 403. In the embodiment in FIGS. 4A and 4B, the EMI shield, which includes conductive layer 408 and wirebond cage 406, can be formed in a similar manner as the EMI shield in the embodiment in FIGS. 3A and 3B.

In the embodiment in FIGS. 4A and 4B, the invention's overmolded package includes conductive layer 408, which provides EMI shielding over components 402 and 403, wirebond cage section 407, which provides EMI shielding around components 402 and 403, and wirebond cage section 409, which provides EMI shielding between components 402 and 403. Thus, in the embodiment in FIGS. 4A and 4B, the invention utilizes a conductive layer and wirebond cage sections to advantageously achieve an effective EMI shield between two components inside an overmolded package and the environment outside of the package and an effective EMI shield between the two components inside the package. The embodiment in FIGS. 4A and 4B also provides similar advantages as discussed above for the embodiment in FIGS. 1A and 1B.

Figure 5:
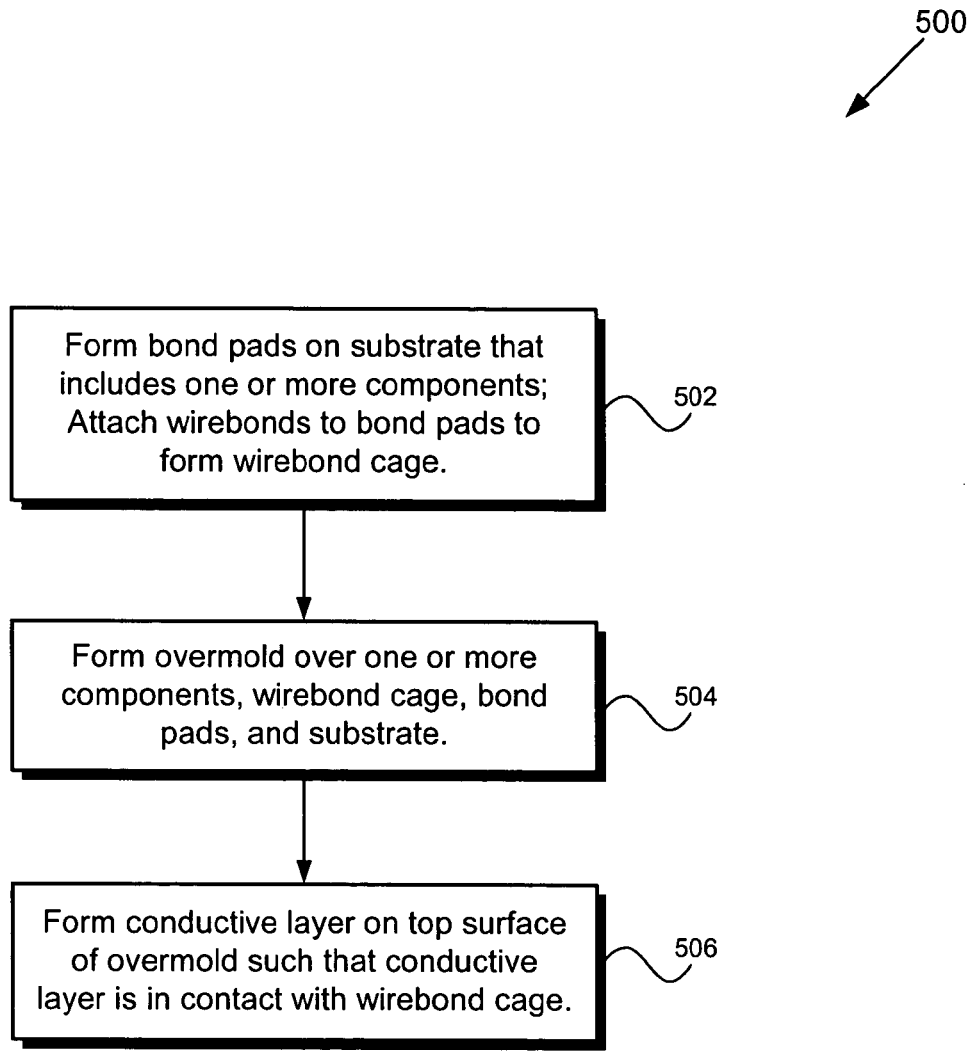
FIG. 5 is a flowchart corresponding to exemplary method steps according to one embodiment of the present invention.

FIG. 5 shows a flowchart illustrating an exemplary method according to one embodiment of the present invention. Certain details and features have been left out of flowchart 500 that are apparent to a person of ordinary skill in the art. For example, a step may consist of one or more substeps or may involve specialized equipment or materials, as known in the art. At step 502, bond pads are formed on a substrate that includes one or more components and wirebonds are attached to the bond pads to form a wirebond cage. For example, bonds pads 104a through 104d in FIG. 1B can be formed on substrate 114, which includes component 102, by depositing and patterning a layer of copper, aluminum, or other suitable metal. For example, wirebonds 110a and 110b can be attached to respective bond pads 104a and 104b and bond pads 104c and 104d by using a suitable bonding process to form wirebond cage 106.

At step 504, an overmold is formed over one or more components, the wirebond cage, the bond pads, and the substrate. For example, overmold 116 in FIG. 1B, which can comprise an epoxy molding compound, can be formed over component 102, wirebond cage 106, which includes wirebonds 110a and 110b, bond pads 104a through 104d, and substrate 114 in a molding process in a manner known in the art. At step 506, a conductive layer is formed on a top surface of the overmold such that the conductive layer is in contact with the wirebond cage. For example, overmold 116 can be formed such that middle portions 111 and 113 of respective wirebonds 110a and 110b are exposed. Conductive layer 108 in FIG. 1B can then be formed by applying a conductive ink over exposed middle portions 111 and 113 of respective wirebonds 110a and 110b and on top surface 118 of overmold 116. The conductive ink can be applied by utilizing a spraying process, electroplating process, thermal spray deposition process, or other suitable process, for example.

As a result of the process in flowchart 500, an EMI shield, which includes the wirebond cage and the conductive layer, is formed in an overmolded package. For example, an EMI shield, which includes wirebond cage 106 and conductive layer 108, which are electrically connected together, is formed in overmolded semiconductor package 100 in FIGS. 1A and 1B.

Thus, as discussed above, in the embodiments in FIGS. 1A, 1B, 2A, 2B, 3A, 3B, 4A, and 4B, the invention utilizes a conductive layer and a wirebond cage to advantageously achieve an effective EMI shield between one or more components inside an overmolded package and the environment outside of the package. Additionally, in the embodiments in FIGS. 2A, 2B, 4A, and 4B, the invention utilizes a wirebond cage section to achieve an effective EMI shield between two components inside the package. Furthermore, in the embodiments in FIGS. 1A, 1B, 2A, 2B, 3A, 3B, 4A, and 4B, the invention advantageously achieves an effective EMI shield for an overmolded package that has a flexible design, is cost effective, and does not substantially increase the size of the overmolded package.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an overmolded semiconductor package with wirebond cage for EMI shielding has been described.

What is claimed is:

1. A method for fabricating a packaged module, the method comprising:

providing a packaging substrate having a reference potential layer;

mounting one or more components on a surface of the packaging substrate;

forming a plurality of wirebonds on the packaging substrate so as to define a perimeter around and substantially surround the one or more components, each of the plurality of wirebonds having a first end, a second end, and a middle portion, the first and second ends electrically connected to the reference potential layer and separated by a wirebond loop width, wirebonds along the perimeter separated by a wirebond spacing, the wirebond loop width and the wirebond spacing selected to provide electromagnetic shielding for a particular range of frequencies;

forming an overmold that substantially encapsulates the one or more components and the plurality of wirebonds, the overmold including an upper surface where the middle portions of the plurality of wirebonds are exposed; and forming a conductive layer on the upper surface of the overmold so as to be in electrical contact with the middle portions of the plurality of wirebonds, the conductive layer in combination with the plurality of wirebonds and the reference potential layer providing the electromagnetic shielding.

2. The method of claim 1 wherein the combination of the conductive layer, the plurality of wirebonds, and the reference potential layer provides the electromagnetic shielding between the one or more components and an exterior of a volume defined by the overmold above the surface of the packaging substrate.

3. The method of claim 2 wherein the conductive layer, the plurality of wirebonds, and the reference potential layer are dimensioned to provide electromagnetic shielding between interior and exterior locations of the volume.

4. The method of claim 1 wherein the packaging substrate includes a laminate substrate.

5. The method of claim 1 wherein the mounting of one or more components includes mounting a semiconductor die having a radiofrequency (RF) circuitry.

6. The method of claim 1 wherein the mounting of one or more components includes mounting a discrete electronic device.

7. The method of claim 6 wherein the discrete electronic device includes a passive device.

8. The method of claim 1 wherein the first and second ends are electrically connected to the reference potential layer through bond pads on the surface of the packaging substrate.

9. The method of claim 1 wherein the forming of the plurality of wirebonds includes forming a plurality of curved wirebonds, each curved wirebond having the first and second ends that begin and end at the surface of the packaging substrate, respectively.

10. The method of claim 9 wherein at least one of the first and second ends of the curved wirebond is attached to a bond pad on the surface of the packaging substrate.

11. The method of claim 9 wherein the curved wirebond has a loop shape such that the middle portion of the wirebond is at a point or a segment of the wirebond between the first and second ends.

12. The method of claim 9 wherein each of the curved wirebonds defines a plane that is approximately normal to a plane defined by the surface of the substrate.

13. The method of claim 12 wherein the curved wirebonds are arranged such that their planes extend along the perimeter about the one or more components.

14. The method of claim 13 wherein the perimeter defines a rectangular shape.

15. The method of claim 1 wherein the forming of the overmold includes:
providing a molding compound such that the molding compound encapsulates the one or more components and the plurality of wirebonds to a height that is greater than heights of at least some of the wirebonds; and
removing a top portion of the molding compound so as to yield the upper surface of the overmold and expose the middle portions of the wirebonds including the at least some of the wirebonds that were covered by the molding compound.

16. The method of claim 15 wherein the removing of top portion includes a mechanical removal process.

17. The method of claim 1 wherein the forming of the conductive layer includes a spraying process so as to yield the conductive layer.

18. A method for manufacturing a portable radio-frequency (RF) device, the method comprising:
providing a circuit board; and
mounting a packaged device on the circuit board, the packaged device including a packaging substrate having a surface and including a reference potential layer at or below the surface, at least one semiconductor die mounted on the surface of the packaging substrate, a plurality of wirebonds disposed on the surface of the packaging substrate and arranged to define a perimeter around and substantially surround the at least one semiconductor die, each of the plurality of wirebonds having a first end, a second end, and a middle portion, the first and second ends electrically connected to the reference potential layer and separated by a wirebond loop width, wirebonds along the perimeter separated by a wirebond spacing, the wirebond loop width and the wirebond spacing selected to provide electromagnetic shielding for a particular range of frequencies, an overmold that substantially encapsulates the at least one semiconductor die and the plurality of wirebonds, the overmold including an upper surface where the middle portions of the plurality of wirebonds are exposed, and a conductive layer disposed on the upper surface of the overmold so as to be in electrical contact with the middle portions of the plurality of wirebonds, the conductive layer in combination with the plurality of wirebonds and the reference potential layer providing the electromagnetic shielding.

19. The method of claim 18 wherein the RF device includes a cellular phone.

20. A method of forming an overmolded package, the method comprising:
forming a wirebond cage around a component situated on a substrate, the wirebond cage including a plurality of wirebonds and defining a perimeter substantially surrounding the component, each of the plurality of wirebonds having a first end, a second end and a middle portion, each of the first and second ends electrically connected to a reference potential layer below a surface of the substrate and separated by a wirebond loop width, wirebonds along the perimeter separated by a wirebond spacing;
selecting the wirebond loop width and the wirebond spacing to provide electromagnetic shielding for a particular range of frequencies;
forming an overmold over the component, the wirebond cage, and the substrate, the overmold encapsulating the wirebond cage so as to define an upper surface where the middle portions of at least some of the plurality of wirebonds are exposed; and
forming a conductive layer on the upper surface of the overmold so as to be in electrical contact with the exposed middle portions of the at least some of the plurality of wirebonds, the conductive layer in combination with the wirebond cage and the reference potential layer providing the electromagnetic shielding for the selected range of frequencies.

21. The method of claim 20 wherein the wirebond cage in electrical contact with the reference potential layer and the conductive layer in electrical contact with the wirebond cage through the exposed middle portions of the at least some of the plurality of the wirebonds forms an EMI shield over the component and an exterior of a volume defined by the overmold above the surface of the substrate.

22. The method of claim 21 wherein the first and second ends are electrically connected to the reference potential layer through bond pads situated on the substrate.

23. The method of claim 22 wherein the bond pads are substantially aligned along the perimeter.

* * * * *